United States Patent [19]

Wolf

[11] 3,801,921

[45] Apr. 2, 1974

[54] AMPLIFIER ARRANGEMENT

[75] Inventor: Gerrit Wolf, Lahore, Pakistan

[73] Assignee: U.S. Phillips Corporation, New York, N.Y.

[22] Filed: June 1, 1971

[21] Appl. No.: 148,417

[30] Foreign Application Priority Data

June 5, 1970 Great Britain .................... 27241/70

[52] U.S. Cl. ........................ 330/15, 330/17, 330/22

[51] Int. Cl. ............................................. H03f 3/26

[58] Field of Search ............ 330/13, 15, 17, 22, 40, 330/19, 25; 307/297

[56] References Cited

UNITED STATES PATENTS

| | | | |
|---|---|---|---|
| 3,327,131 | 6/1967 | Grimmer | 307/297 |
| 3,550,024 | 12/1970 | Hongu et al. | 330/17 X |
| 3,553,500 | 1/1971 | Easter | 330/17 X |

*Primary Examiner*—Herman Karl Saalbach
*Assistant Examiner*—Lawrence J. Dahl
*Attorney, Agent, or Firm*—Frank R. Trifari

[57] ABSTRACT

Correction of the setting point of a transistor amplifier stage with supply voltage variations by supplying additional base biasing current, which compensates the influence of the base-emitter voltage.

6 Claims, 3 Drawing Figures

INVENTOR.
GERRIT WOLF
BY
Frank R. Trifari
AGENT

INVENTOR.

GERRIT WOLF

BY

AGENT

AMPLIFIER ARRANGEMENT

The invention relates to a transistor amplifier arrangement comprising at least one transistor whose collector-emitter path is fed from a supply source, whereas the base of said transistor receives a biasing current at least via a resistor from a voltage proportional to the voltage of said supply source. Amplifier arrangements of this kind have the disadvantage that a deviation of the supply voltage from the nominal value gives rise to asymetrical distortion under conditions of full excitation.

The invention has for its object to obviate this disadvantage.

A transistor amplifier arrangement of the kind set forth in accordance with the invention is characterized in that the base is furthermore coupled with a source supplying a further biasing current compensating at least partly the influence of the emitter-base voltage so that the biasing base current of said transistor is substantially proportional to said supply voltage.

Owing to the compensating effect of the supplementary base current the bias of the transistor with a varying supply voltage will invariably remain so that full symmetrical excitation can be achieved. This is particularly important, for example, for the audio output stages of battery receivers of their driver-stages.

The invention will be described with reference to the drawing.

Figure 1:
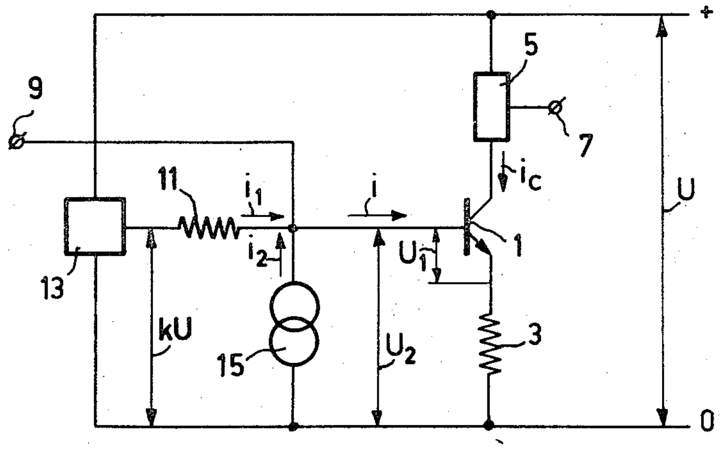
FIG. 1 illustrates by a simple basic diagram a transistor amplifier stage in accordance with the invention.

Referring to FIG. 1, the emitter of an npn-type transistor 1 is connected through a resistor 3 to a terminal O and the collector through a load impedance 5 to a terminal + of a supply source having a voltage U. The load impedance 5 has connected to it an output 7 terminal, which may be coupled directly or through a separation capacitor or –transformer with the collector and the load impedance of the transistor.

The base of the transistor 1 is connected to an input 9 and via a resistor 11 to a first source 13, which provides a voltage *k*U proportional to the voltage U and a biasing current $i_1$ and to a second source 15, which supplies a further biasing current $i_2$ to the base.

The overall biasing current fed to the base now is:

$= i_1 + i_2$ wherein $i_1 = kU - U_2/R_{11}$ $U_2$ = the voltage at the base of the transistor 1 relative to the terminal O, $= U_1 + i_c R_3$, $U_1$ = the base-emitter voltage of the transistor 1, $i_c$ = the collector current $= \alpha' i$ $\alpha'$ = the current amplification factor of the transistor 1, from which it follows that $i = kU - U_1 - \alpha' i R_3/R_{11} + i_2$ $$i\,[1 + \alpha'(R_3/R_{11})] = k\,U/R_{11} + [i_2 - (U_1/R_{11})] \quad (1)$$

Figure 2:
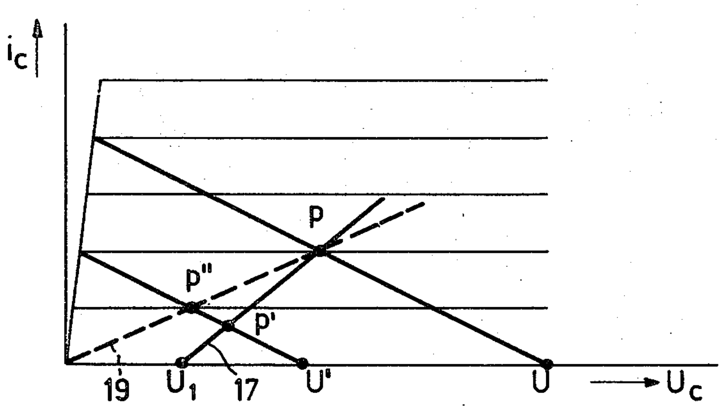
FIG. 2 illustrates by an idealized collector voltage-current characteristic curve the variation of the setting point of a stage as shown in FIG. 1.

FIG. 2 shows in a collector voltage-current ($U_c - I_c$) characteristic co-ordinates two of lines 17 and 19 passing through a working point P chosen at the desired supply voltage $U$.

The line 17, PP′, indicates the shift of the working point P with a varying supply voltage $U$, if as usual only the biasing current $i_1$ is fed to the base. ($i_2 = 0$ in formula (1)). With a lower supply voltage $U'$ the working point lies at P′. A full symmetrical excitation is possible at the initial working point P, but no longer at the new working point P′.

The line 19 PP″ indicates the shift of the working point P with a variation of the supply voltage $U$, if apart from the biasing current $i_1$ also a biasing current $i_2$ is fed to the base in accordance with the invention. With the lower supply voltage U′ the working point lies at P″ and a symmetrical, full excitation remains possible.

In order to cause the working point P to shift along the line 19 the term $[i_2 - (U_1/R_{11})]$ of formula (1) has to be equal to 0 and the additional base biasing current $i_2$ has therefore to be equal to $U_1/R_{11}$ (2). The influence of the base-emitter voltage $U_1$ is then compensated by the setting current $i_2$. It will be obvious that a slightly differing value of $i_2$ is also capable of providing some improvement in the excitation symmetry.

The current $i_2$ may be obtained in a simple manner, if the resistor $R_3$ is of such a low value that the voltage drop across it is small as compared with the base-emitter voltage $U_1$.$U_2$ is then approximately equal to $U_1$. If the source 15 is formed by a voltage source having a voltage proportional to $U_1$ in series with a resistor, the said condition can be easily satisfied. This voltage may emanate from a plurality of diodes traversed in series by a current or from an arrangement of the kind shown in FIG. 3. When a larger emitter resistor $R_3$ is used, this series connection of diodes must include also a resistor and it has to be fed by a voltage proportional to the supply voltage $V$. The latter will be apparent from the following:

Suppose the current $i_2$ is furnished by a voltage source $U_{15}$ having an internal resistance $R_{15}$.

According to formula (1):

$$i[(1 + \alpha\,'(R_3/R_{11})] = k\,U/R_{11} + (i_2 - (U_1/R_{11})] \quad (1)$$

wherein in accordance with (2) $i_2 = U_1/R_{11}$ (2)

and hence $$i[1 + \alpha'(33/R_{11})] = k\,U/R_{11}$$

$$i = (K/R_{11} + \alpha' R_3)\,U \quad (3)$$

Furthermore $U_2 = U_1 + \alpha' i R_3$; (3) inserted gives:

$$U_2 = U_1 + \alpha'(kR_{(3}/R_{11} + \alpha' r_3)$$

In accordance with (2): $i_2 = U_1/R_{11}$

Also $i_2 = U_{15} - U_2/R_{15} = U_{15} - U_1 - \alpha'(kR_3/R_{11} + \alpha' R_3)U/R_{15}$ Hence $U_1/R_{11} = U_{15}/R_{15} - U_1/R_{15} - 1/R_{15}\,(k\,\alpha' R_3/R_{11} + \alpha' R_3)U$ from which it follows that $$U_{15}/R_{15} = U_1\,[1/R_{11} + 1/R_{15}] + 1/R_{15}\,(k\,\alpha' R_3/R_{11} + \alpha' R_3)U$$

$$U_{15} = [1 + (R_{15}/R_{11})]\,U_1 + (k\,\alpha' R_3/R_{11} + \alpha' R_3)\,U$$

Hence the voltage $U_{15}$, when using an emitter resistor $R_3$, has to be formed by a portion proportional to $U_1$, i.e. the base-emitter voltage of the transistor 1 and a portion proportional to $U$, i.e. the voltage of the supply source, which can be achieved in a simple manner by the arrangement described above.

Figure 3:
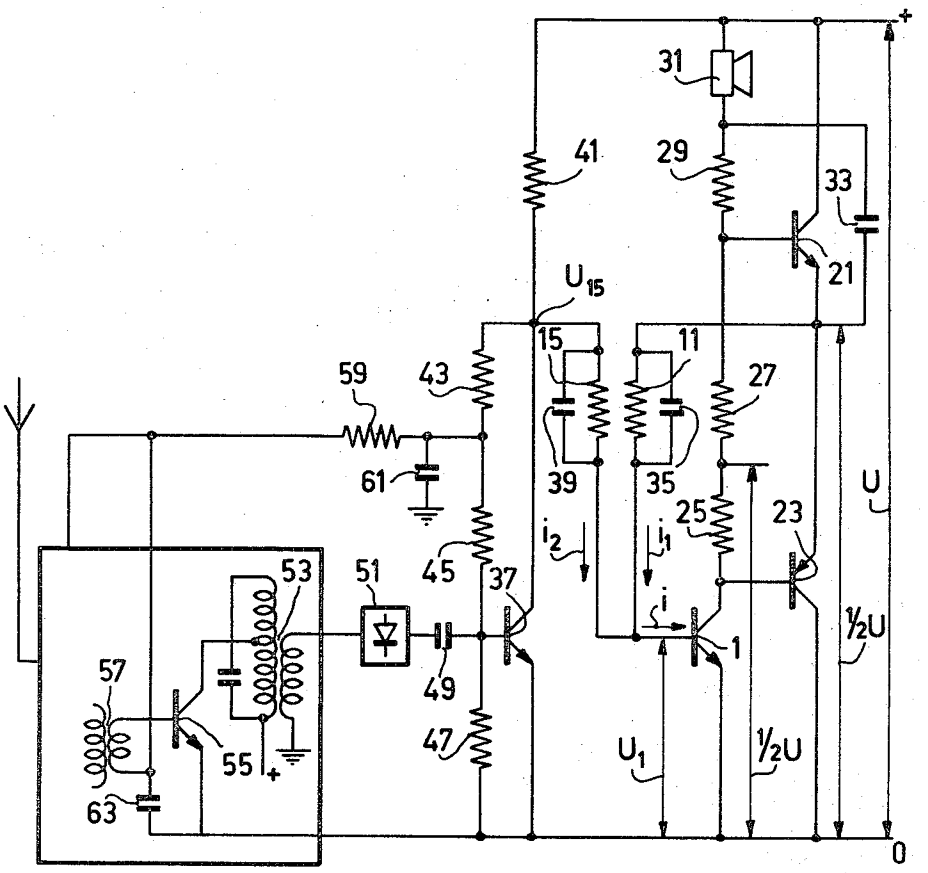
FIG. 3 illustrates by a simplified basic diagram a transistor amplifier arrangement in a further embodiment of the invention for use in a radio receiver.

In FIG. 3 corresponding parts are designated by the same reference numerals as in FIG. 1. The transistor 1 is connected as a control-stage for a series-connected push-pull output stage comprising an npn-transistor 21 and a pnp-transistor 23.

The collector of the transistor 21 is connected to the + terminal of the supply source $U$, the emitter is connected to the emitter of the transistor 23, whose collector is connected to the O terminal of the supply source $U$.

The base of the transistor 23 is connected to the collector of the transistor 1, which is furthermore connected via the series connection of a plurality of resistors 25, 27 and 29 and a loudspeaker 31 to the positive terminal of the supply source U.

An alternating voltage path is provided between the loudspeaker and the common connection of the emitters of the transistors 21 and 23 by means of a capacitor 33.

To the emitters of these transistors is furthermore connected the resistor $R_{11}$ so that the biasing current $i_1$ is fed to the base of the transistor 1. The resistor 11 is shunted for alternating voltage by a capacitor 35.

The biasing current $i_2$ for the base of the transistor 1 is obtained via a resistor 15, which is connected to the collector of an npn-transistor 37. For alternating voltage the resistor 15 is shunted by a capacitor 39. The transistor 37 forms part of a preceding amplifier stage and has its collector connected via a resistor 41 to the positive terminal of the supply source $U$.

For direct voltages the transistor 37 forms a direct-voltage stabilizer. The base thereof is connected for this purpose to a tapping of a series connection of resistors 43, 45 and 47 from the collector to the O terminal of the supply source $U$.

The base of the transistor 37 is connected to the junction of the resistors 45 and 47 and the emitter is connected to the O terminal of the supply source $U$. The direct-voltage at the collector of the transistor is, owing to this arrangement: $n.U_{Ube}$, wherein:

$n = R_{43} + R_{45} + R_{47}/R_{47}$ and $U_{be}$ is the base-emitter voltage of the transistor.

For alternating voltages the base of the transistor is connected via a capacitor 49 to an output of a detector circuit 51, an input of which is coupled via an intermediate-frequency transformer with the collector of an npn-transistor 55.

The emitter of the transistor 55 is connected to the O terminal of the supply source $U$, whereas the base is connected via a winding of the intermediate-frequency transformer 57 and a resistor 59 to the junction of the resistors 43 and 45 of the stabilizing circuit. The arrangement comprises furthermore two decoupling capacitors 61 and 63, which connect the ends of the resistor 59 for alternating voltages to the O terminal of the supply source $U$.

The transistor 1, like the embodiment shown in FIG. 1, is adjusted so that at the supply voltage $U$ a symmetrical excitation is possible. The junction of the resistors 25 and 27, which is at a potential equal to the average of the base potentials of the transistors 21 and 23 is then $U/2$. This is also the potential of the emitters of the transistors 21 and 23.

The setting of the transistor 1 is such that the voltage at the junction of the resistors 25 and 27 always remains $U/2$ for any value of $U$ so that also the voltage at the emitters of the transistors 21 and 23 remains $U/2$.

The biasing of the transistor 1 is obtained by the biasing current $i_1$ via the resistor 11 connected to the voltage $kU = ½U$ and by the biasing current $i_2$ via the resistor 15, connected to a voltage $U_{15} = n.U_{be}$.

With a correct choice of the various resistance values the condition set forth in the preceding embodiment for the biasing of the transistor 1 can be satisfied, since:

$$i = i_1 + i_2 = ½U - U_1/R_{11} + n\ U_{be} - U_1/R_{15}$$
$$= ½U/R_{11} + [n\ U_{be}/R_{15} - (1/R_{11} + 1/R_{15})\ U_1]$$
$$= ½U/R_{11}\ if\ n\ U_{be}/R_{15} = (1/R_{11} + 1/R_{15})\ U_1$$

Hence $U_{be}/U_1 = [(1/R_{11}) + (1/R_{15})/n(1/R_{15})] = 1/n\ (1+ R_{15}/R_{11})$ Now $U_{be}/U_1 = 1$ so that $R_{15}/R_{11}$ must $= n - 1$. If an emitter resistor is used for the transistor 1, a satisfactory compensation can nevertheless be obtained, if a resistor is also included in the emitter circuit of the transistor 37.

The stabilizing circuit supplying the additional biasing current $i_2$ for the transistor 1 also supplies a stabilized voltage to the resistor 59, which provides the biasing of one or more high-frequency or intermediate-frequency transistors such as 55, so that in the event of supply voltage variations not only the optimally distortion-free controllability but also the sensitivity of the receiver are maintained.

It will be obvious that the aforesaid direct-voltage coupling can be maintained independently of the alternating-current excitation methods used. The transistor 1 for instance may be driven by alternating voltages in a common base connection.

Although silicon transistors have a high base-emitter voltage for a given supply voltage $U$which is relatively higher than that of germanium transistors, the method described may, of course, be employed for both types of transistors. Even pnp-transistors may be operative in this way provided the appropriate polarities of the various supply voltages and currents are adapted.

As described, the transistor 1 constitutes a driver stage, but it may have any desired function in an amplifier and it may even from a class A output stage.

It will be furthermore be obvious that in the arrangement of FIG. 3 the collector resistor of the transistor 1 has to be chosen in accordance with the further parameters of the circuit; whilst neglecting the base currents of the transistors 21 and 23, which are connected in class B $(R_{27} + R_{29} + R_{31})$ has to be equal to $½U$, wherein $i_c = \alpha' i = \alpha'\ ½U/R_{11}$ so that $\alpha'\ ½U/R_{11}\ (R_{27}+R_{29}+R_{31}) = ½U$ and hence $R_{27} + R_{29} + R_{31} = 1/\alpha'\ R_{11}$.

What is claimed is:

1. A transistor amplifier arrangement comprising a transistor having collector and emitter electrodes providing a collector-emitter path and a base electrode, a load impedance connected in series with the path, a supply voltage applied across the series connected impedance and path, a biasing voltage substantially proportional to the supply voltage, a resistance connected between the biasing voltage and the base electrode for applying a first biasing current to the base electrode, a biasing current supply means connected to the base terminal for applying a second biasing current to the base electrode, the second biasing current being substantially proportional to the voltage between the base and emitter electrodes, whereby the sum of the first and second biasing currents is substantially proportional to the supply voltage.

2. A transistor amplifier arrangement as claimed in claim 1 characterized in that the biasing current supply means is a voltage source which is connected through a resistor to the base electrode.

3. A transistor amplifier arrangement as claimed in claim 2 characterized in that the voltage source supplies a voltage which is substantially proportional to the voltage between said base and emitter terminals.

4. A transistor amplifier arrangement as claimed in claim 3 characterized in that the voltage source is at least one preceding amplifying stage connected as a direct voltage stabilizer.

5. A transistor amplifier arrangement as claimed in claim 1 characterized in that the biasing voltage is obtained from the output of an amplifying stage following the transistor and coupled via a resistor to the base of the transistor, said resistor also functioning as a feedback resistor.

6. A transistor amplifier arrangement as claimed in claim 5 characterized in that the amplifying stage following the transistor is a series-connected push-pull output amplifier comprising a complementary pair of transistors.

* * * * *